United States Patent
Deaton et al.

(10) Patent No.: US 10,540,467 B1
(45) Date of Patent: Jan. 21, 2020

(54) SYSTEM, METHOD, AND COMPUTER PROGRAM PRODUCT FOR HANDLING COMBINATIONAL LOOPS ASSOCIATED WITH THE FORMAL VERIFICATION OF AN ELECTRONIC CIRCUIT DESIGN

(71) Applicant: Cadence Design Systems, Inc., San Jose, CA (US)

(72) Inventors: Craig Franklin Deaton, Rowlett, TX (US); Abner Luis Panho Marciano, Belo Horizonte-Minas Gerais (BZ); Matheus Nogueira Fonseca, Betim-Minas Gerais (BZ); Ronalu Augusta Nunes Barcelos, Belo Horizonte-Minas Gerais (BZ); Fabiano Cruz Peixoto, Belo Horizonte (BZ)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/943,819

(22) Filed: Apr. 3, 2018

(51) Int. Cl.
*G06F 17/50* (2006.01)

(52) U.S. Cl.
CPC ........ *G06F 17/504* (2013.01); *G06F 17/5022* (2013.01)

(58) Field of Classification Search
CPC ............................ G06F 17/504; G06F 17/5022
USPC .......................................................... 716/106
See application file for complete search history.

(56) References Cited

U.S. PATENT DOCUMENTS

2017/0024508 A1* 1/2017 Mneimneh .......... G06F 17/5081
2017/0193154 A1* 7/2017 Sul .................... G01R 31/31831

OTHER PUBLICATIONS

Weng, Wan-Chen et al., "Using Structural Relations for Checking Combinationality of Cyclic Circuits," Design, Automation & Test in Europe Conference & Exhibition 2015, IEEE, 4 pages (Mar. 13-19, 2015).

* cited by examiner

*Primary Examiner* — Suchin Parihar
(74) *Attorney, Agent, or Firm* — Mark H. Whittenberger, Esq.; Holland & Knight LLP

(57) ABSTRACT

The present disclosure relates to a method for electronic circuit design. Embodiments may include receiving, using a processor, an electronic circuit design and identifying at least one combinational loop associated with the electronic circuit design. Embodiments may also include extracting, for each component of the loop, a set of logic conditions and modeling the at least one combinational loop. Embodiments may further include providing a graphical user interface configured to display one or more constraint candidates and determining whether or not a conflict exists between constraint candidates. Embodiments may also include ranking the constraint candidates, based upon, at least in part, a number of loops disabled and one or more disabled loop characteristics.

20 Claims, 17 Drawing Sheets

SYSTEM, METHOD, AND COMPUTER PROGRAM PRODUCT FOR HANDLING COMBINATIONAL LOOPS ASSOCIATED WITH THE FORMAL VERIFICATION OF AN ELECTRONIC CIRCUIT DESIGN

FIELD OF THE INVENTION

The present disclosure relates to electronic design verification, and more specifically, to a method for handling combinational loops associated with formal verification.

DISCUSSION OF THE RELATED ART

Formal verification of an electronic design relies upon a system of constraints to communicate the legal state space to the proof engines. Test and control logic, PAD-ring logic, and various optimization techniques can introduce combinational loops on an electronic design. A combinational loop means that there is a non-sequential path between one point and itself. When such structures are built by intent/design, they are called "intentional loops". Loops in this category are usually functionally false. In other words, although structurally a combinational loop, a value will never propagate back.

When loops are purely structural, electronic design automation ("EDA") tools, such as formal and routing, can leverage optimizations and lead to more precise models. However, ensuring a loop is safe to be represented on these domains is a costly and intricate operation. Moreover, inspecting such constructions manually is difficult, error-prone and very often impracticable, given the scale of current electronic designs.

There are also cases of "intentional loops" that are functionally true but only on invalid states of the DUT. In such cases, verification engineers need to break, either manually or automatically, the loop path in order to proceed with verification. A wrong assessment (manual or automatic) may lead to false positives and false negatives.

In order to proceed safely in the presence of structural loops, it is often necessary to determine whether they are functional or not (i.e., to determine whether or not a value can propagate completely around the full loop). One obvious approach to this problem that is already available in industry is to use a dual-rail model. In this technique, two instances of the relevant design logic (that is, the logic contained in the loop itself, as well as the driver logic that fans into the loop logic) are instantiated side-by-side, all free signals in one instance are tied to the corresponding signals in the other instance, and the relevant initial state is applied to both instances. With this setup established, both loops are broken at some arbitrary point (the same point in each loop), converting the closed loops into open arcs, and the new free input at the head of one arc is tied to the corresponding new free input at the head of the other arc. If it can be proven, under the stated constraints, that this difference applied to the "input" ends of the arcs can never propagate to the output ends (in other words, if it can be proven that the output end of one arc instance will always have the same value as the output end of the other arc instance), then the loop being analyzed is merely structural, and not functional.

Although the dual-rail approach is intuitive and analytically sound, it can be problematic in that it forces the duplication of both the loop logic and the driving logic. This can lead to both complexity and state-space explosion, which often results in a failure of the analysis to converge and prevents the analysis from producing useful results (either at all or in a reasonable time).

In addition, real designs often contain a large number of structural loops, and logic that is a part of the structural path for one loop may serve as driving logic for another loop such that breaking the first loop to create an arc may allow ordinarily unreachable violation traces to occur for the second loop, causing it to be falsely classified as functional. For this reason, and others, the dual-rail approach is typically limited to analyzing loops one at a time. This serial analysis represents yet another bottleneck inherent to the dual-rail approach.

Existing art unrolls combinational loops and performs analysis on the underlying logic. However, several problems arise from this analysis. The main problem lies in the complexity included when analyzing the full combinational loop path, as verifying it could take as long as the final formal verification to be conducted on the netlist in which the loop resides. Moreover, the existence of neighboring combinational loops leads to the need of additional techniques and refinements to scale/handle such structures.

There are two conventional approaches to handle combinational loops, one manual and the other automatic. The first one relies on a visual inspection of loops, searching for places to break the loop path. The later one, the automatic approach, finds places to break the loop (i.e. cut the actual connection between signals). If the loop path is structurally broken with no constraints tying their ends, both approaches will free up logic, thus leading to possibly false negatives proof results. If the broken loop path ends are constrained to be equal, this may lead to false positives. Moreover, such loop cut-points might not be consistent across different formal proof runs, which can lead to different results.

Summary of Disclosure

In one or more embodiments of the present disclosure, a computer-implemented method for electronic circuit design is provided. The method may include receiving, using a processor, an electronic circuit design and identifying at least one combinational loop associated with the electronic circuit design. The method may also include extracting, for each component of the loop, a set of logic conditions and modeling the at least one combinational loop. The method may further include providing a graphical user interface configured to display one or more constraint candidates and determining whether or not a conflict exists between constraint candidates. The method may also include ranking the constraint candidates, based upon, at least in part, a number of loops disabled and one or more disabled loop characteristics.

One or more of the following features may be included. In some embodiments, the one or more disabled loop characteristics and/or loop candidate to be disabled may include a measure of loop stability. The one or more disabled loop characteristics may include one or more known problematic structures. The one or more disabled loop characteristics may include a type of constrained signal. The method may include displaying a minimal group of the ranked constraint candidates that disables all of the at least one combinational loop at the graphical user interface. The method may also include displaying a full set of the ranked constraint candidates at the graphical user interface. The method may further include disabling the at least one combinational loop using one or more constraints.

In one or more embodiments of the present disclosure a computer-readable storage medium having stored thereon instructions, which when executed by a processor result in one or more operations is provided. Operations may include receiving, using a processor, an electronic circuit design and identifying at least one combinational loop associated with the electronic circuit design. Operations may also include extracting, for each component of the loop, a set of logic conditions and modeling the at least one combinational loop. Operations may further include providing a graphical user interface, textual user interface, or similar interface configured to display one or more constraint candidates and determining whether or not a conflict exists between constraint candidates. Operations may also include ranking the constraint candidates, based upon, at least in part, a number of loops disabled and one or more disabled loop characteristics.

One or more of the following features may be included. In some embodiments, the one or more disabled loop characteristics may include a measure of loop stability. The one or more disabled loop characteristics may include one or more known problematic structures. The one or more disabled loop characteristics may include a type of constrained signal. Operations may include displaying a minimal group of the ranked constraint candidates that disables all of the at least one combinational loop at the graphical user interface. Operations may also include displaying a full set of the ranked constraint candidates at the graphical user interface. Operations may further include disabling the at least one combinational loop using one or more constraints.

In one or more embodiments of the present disclosure, a system is provided. The system may include a computing device having at least one processor configured to receive, using a processor, an electronic circuit design. The at least one processor may be further configured to identify at least one combinational loop associated with the electronic circuit design. The at least one processor may be further configured to extract, for each component of the loop, a set of logic conditions. The at least one processor may be further configured to model the at least one combinational loop and provide a graphical user interface configured to display one or more constraint candidates. The at least one processor may be further configured to determine whether or not a conflict exists between constraint candidates and rank the constraint candidates, based upon, at least in part, a number of loops disabled and one or more disabled loop characteristics.

One or more of the following features may be included. In some embodiments, the one or more disabled loop characteristics may include a measure of loop stability. The one or more disabled loop characteristics may include one or more known problematic structures. The one or more disabled loop characteristics may include a type of constrained signal. The at least one processor is further configured to display a minimal group of the ranked constraint candidates that disables all of the at least one combinational loop at the graphical user interface. The at least one processor is further configured to display a full set of the ranked constraint candidates at the graphical user interface. The at least one processor is further configured to disable the at least one combinational loop using one or more constraints.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 13 is a diagram depicting an embodiment in accordance with the present disclosure;

DETAILED DESCRIPTION

Figure 1:
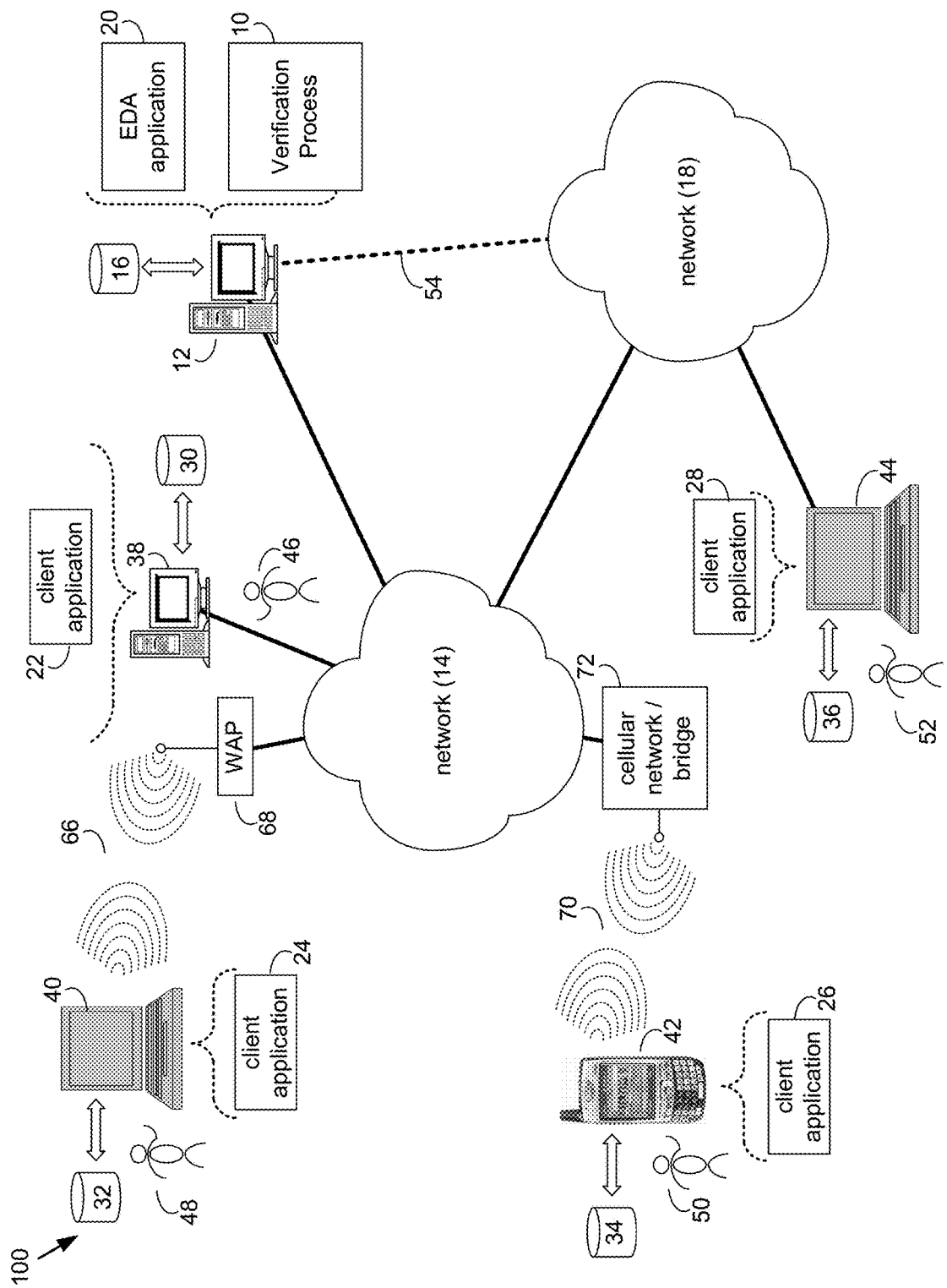
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Referring to FIG. 1, there is shown a verification process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, verification process 10 may reside on and be executed, in whole or in part, by a client electronic device, such as a personal computer, notebook computer, personal digital assistant, or the like.

The instruction sets and subroutines of verification process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Web server is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization and/or verification.

Verification process 10 may be a stand alone application, or may be an applet/application/script that may interact with and/or be executed within EDA application 20. In addition/ as an alternative to being a server-side process, verification process 10 may be a client-side process (not shown) that may reside on a client electronic device (described below) and may interact with an EDA client application (e.g., one or more of EDA client applications 22, 24, 26, 28). Further, verification process 10 may be a hybrid server-side/client-side process that may interact with EDA application 20 and an EDA client application (e.g., one or more of client applications 22, 24, 26, 28). As such, verification process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize verification process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both).

Figure 2:
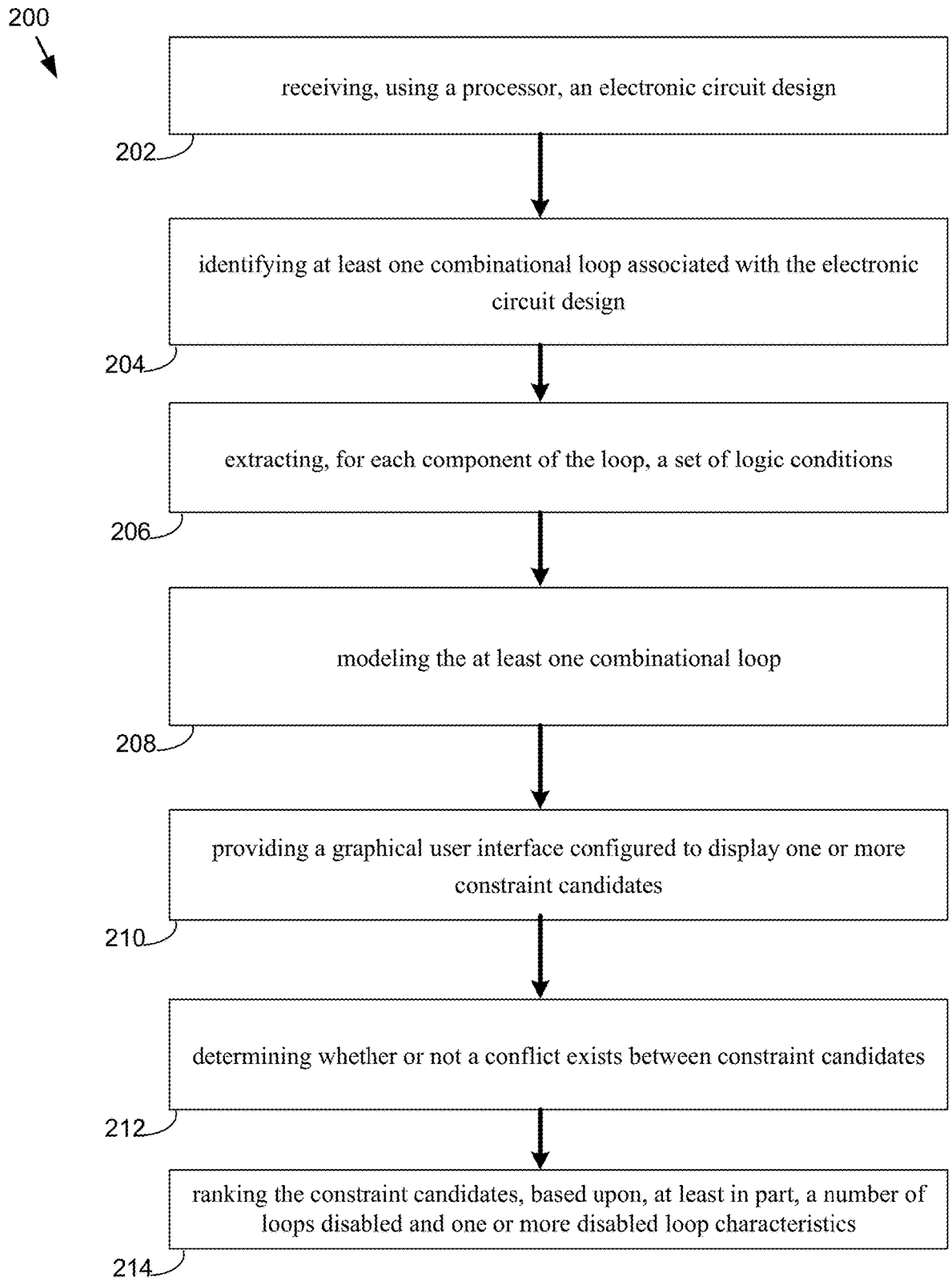
FIG. 2 is a flowchart depicting operations consistent with the verification process in accordance with an embodiment of the present disclosure.

Referring now to FIG. 2, an exemplary flowchart 200 depicting operations consistent with verification process 10 is provided. Embodiments may include receiving (202), using a processor, an electronic circuit design and identifying (204) at least one combinational loop associated with the electronic circuit design. Embodiments may also include extracting (206), for each component of the loop, a set of logic conditions and modeling (208) the at least one combinational loop. Embodiments may further include providing (210) a graphical user interface configured to display one or more constraint candidates and determining (212) whether or not a conflict exists between constraint candidates. Embodiments may also include ranking (214) the constraint candidates, based upon, at least in part, a number of loops disabled and one or more disabled loop characteristics.

In some embodiments, modeling the at least one combination loop may include modeling the conditions that disable the loop. Additionally and/or alternatively, modeling may include modeling inputs that gate the loop (e.g., enable/ disable). As used herein, the phrase "purely structural", may indicate that the loop is just structural and has no backpropagation. Moreover, a structural loop may refer to a structure that has a backpropagation path. However, such paths may be either invalid (purely structural) or valid (functional). As is discussed in further detail hereinbelow, embodiments of verification process 10 may provide a two-step flow that guides a user on how to handle "intentional loops" in a formal verification tool such as EDA application 20 shown in FIG. 1. The first step is a systematic and automatic approach to assess if a given loop is purely structural. The general idea of this strategy is to analyze the underlying loop path logic and verify whether the conditions required for the loop path to be closed (i.e. for data to flow) are met using formal verification. If any of these conditions can ever be true the loop is deemed to be not safe. On the second step a new approach on handling combinational loops is presented, by detecting, validating and adding sound constraints that disable loops and further simplify netlist logic, boosting formal proof performance. Also, a visual aid tool that guides the user on adding the minimal amount of constraints that disables a set of combinational loops is provided. These steps ensure that no false positives are found and the noise coming from false negatives, reduced.

Embodiments of verification process 10 may include multiple stages, the first may focus on the efficient classification of combinational loops as either purely structural or functional loops, and the second on guiding the user on handling loops. The first stage relies on the insight that it is not necessary to show the presence or absence of propagating values along the structural path of a loop in order to determine whether or not the loop is functional. This is because each loop is composed of a chain of logical gates, some of which may have one or more inputs that are not part of the loop's structural path and that, because of the logical functions of the gates they feed into, are able to block propagation around the loop. In the event that a given loop meets this criterion, it is possible to automatically extract an expression that, when true, represents a condition (or set of conditions) under which the structural loop being analyzed is a functional, propagating loop. If the loop does not meet the criterion under which the expression can be extracted, or if the expression can be extracted but is subsequently proven false, then the loop is shown to be non functional (i.e., merely structural).

There are several advantages to the proposed technique for detecting functional loops. First, this approach does not require the duplication of any logic, so the complexity and the size of state space needed to prove whether the extracted propagation-enabling expression holds or not are both minimized. Second, because no loop-breaking is done, multiple such proofs can be run in parallel without interfering with one another. Third, in cases where the loop does not meet the criterion for extracting a propagation-enabling expression, no proof needs to be done at all: the loop is functional.

Figure 3:
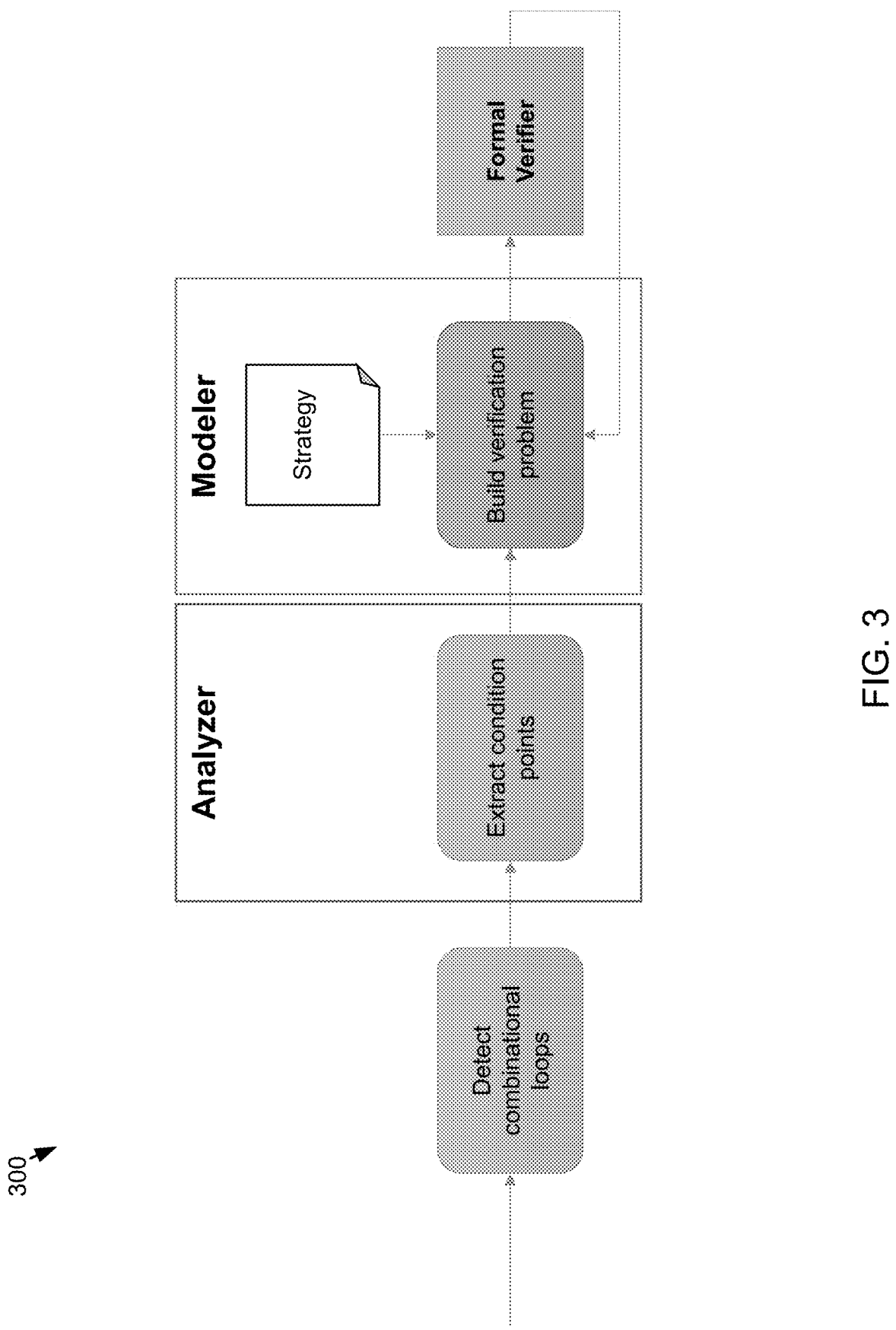
FIG. 3 is a diagram depicting an embodiment in accordance with the present disclosure.
Figure 4:
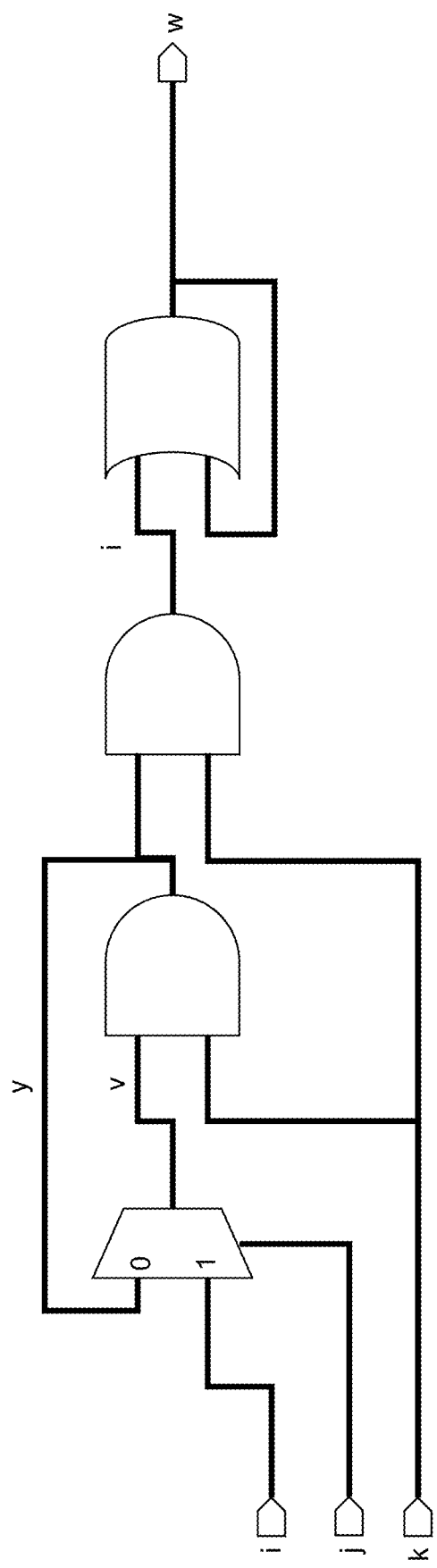
FIG. 4 is a diagram depicting an embodiment in accordance with the present disclosure.

Accordingly, embodiments of verification process 10 may provide an iterative and automated process that first, without user intervention, identifies purely structural combinational loops. As shown in FIG. 3, the flow starts with the detection of loops in the DUT. Next, the detected loops enter the Analyzer module, that may extract, for each component, a set of logic conditions that gate loop propagation. FIG. 4 shows two loops, being the first closed if "j==0" and "k==1", and the second if "i==0". These conditions and the loops they belong to are sent to the next module on the flow, the Modeler.

In some embodiments, the modeler may build the formal verification problems that check if a group of loop paths are open at any point in time. In this example, this means requiring that "j==1 or k==0" always be true for the first loop, and "i==1" always true for the second loop. Any violation of those properties indicates that the loop can be enabled, and is therefore a functional loop. Based on the formal verifier results, the Modeler may refine the problem and/or pick a next set of loops to analyze. The analyzed conditions are based on a strategy which determines how loops are selected, conditions grouped, and the order thereof.

Figure 5:
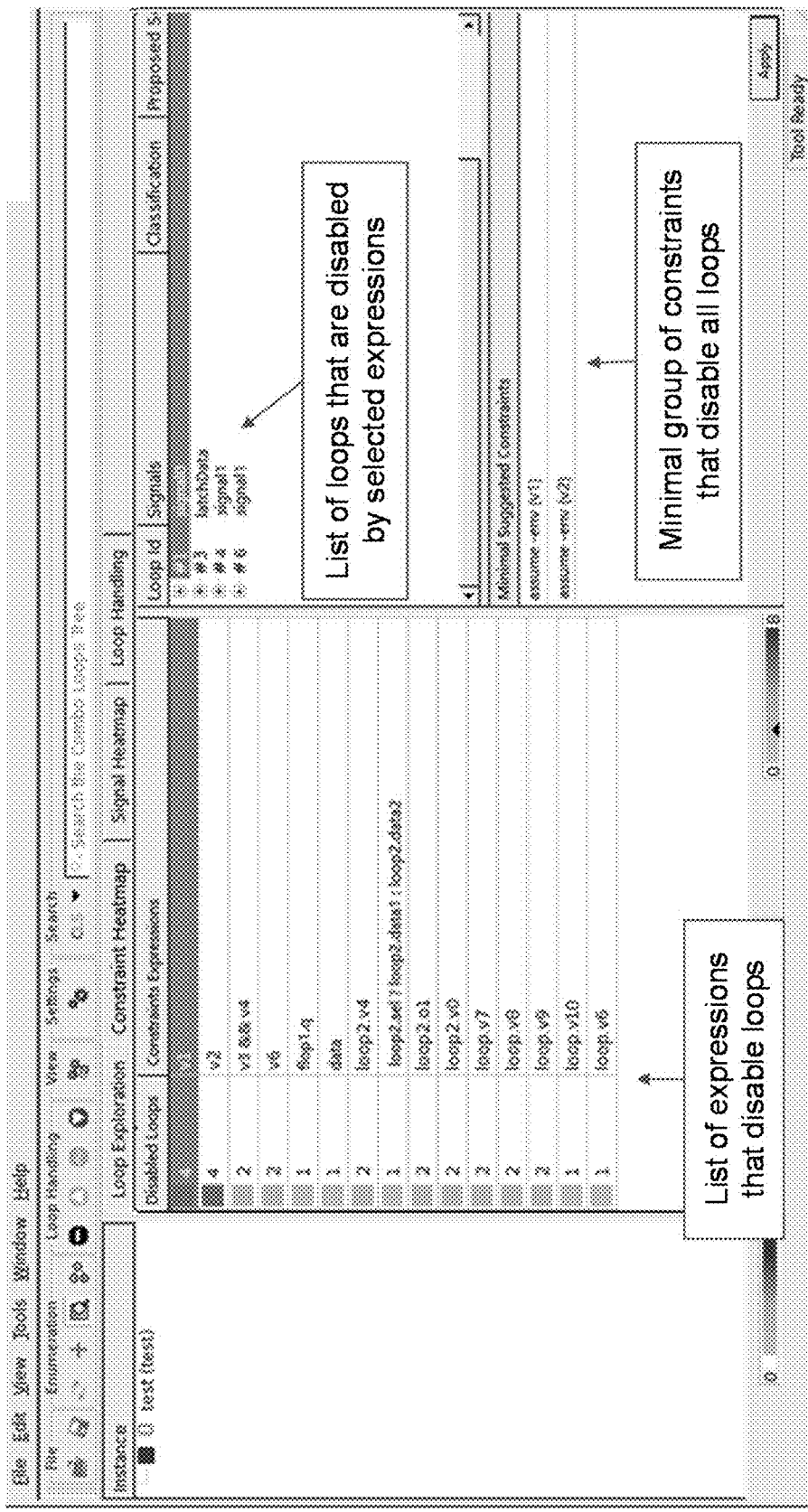
FIG. 5 is a diagram depicting an embodiment in accordance with the present disclosure.

In some embodiments, a second stage of verification process 10 may provide a mechanism to disable loops (both functional and structural) via logical constraints. Verification process 10 may include one or more user interfaces, such as the example shown in FIG. 5. The process may use the conditions extracted by the analyzer module as constraint candidates. A sanity check may then be performed to avoid scenarios of constraint conflicts. The remaining candidates may be ranked based on the number of loops disabled and the disabled loop characteristics. Those characteristics may include, but are not limited to, the loop stability, known problematic structures and constrained signals type. From the ranked set of constraints, either the full set of loop-disabling constraints, or a minimal group that disables loops and unblocks the verification flow, is suggested.

In some embodiments, a measure of loop stability may refer to how often a loop is expected to be stable while in an active circuit. This may include the probability of a loop being unstable and/or functionally true, stability per context (e.g., state which target/formal properties the loop is stable and more, which cycles (if relevant or not) they matter).

Figure 6:
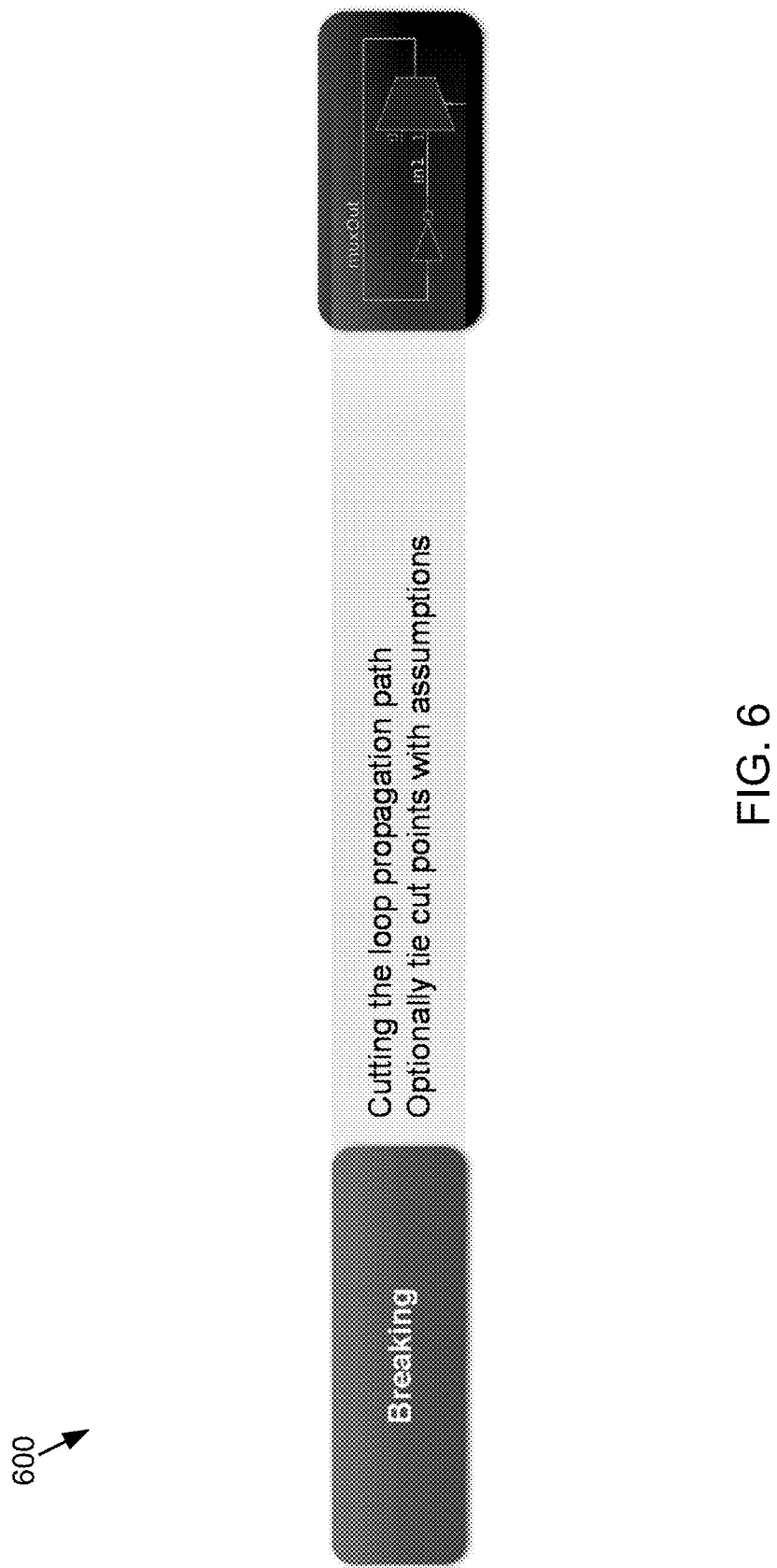
FIG. 6 is a diagram depicting an embodiment in accordance with the present disclosure.

Referring now to FIG. 6, a diagram 600 showing combinational loops in existing systems is provided. Combinational loops do not fit naturally within the cycle-based zero-delay analysis that formal verification is usually based upon. In this way, combinational loops need to be dealt with in some way to force them into the abstract view that the Formal Proof operates within. Handling combinational loops is a time-consuming and non-trivial task.

Figure 7:
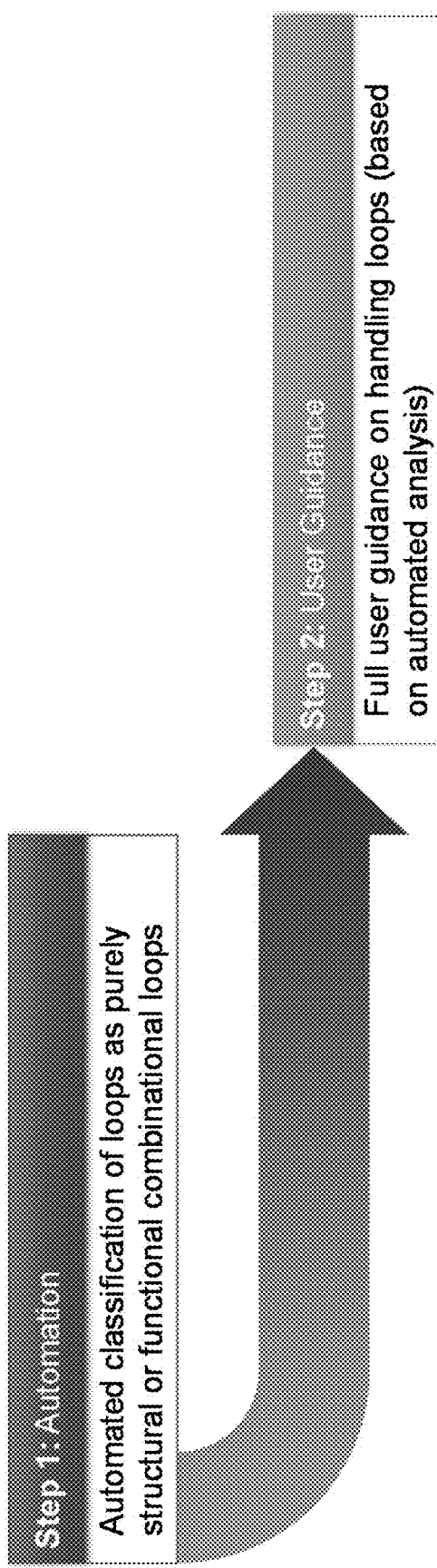
FIG. 7 is a diagram depicting an embodiment in accordance with the present disclosure.

Referring now to FIG. 7, an embodiment showing an automated and assisted way of handling combinational loops in accordance with verification process 10 is shown. The automated classification of loops as purely structural or functional combinational loops is provided in the first step. The second step provides full user guidance on handling loops based on the automated analysis.

Figure 8:
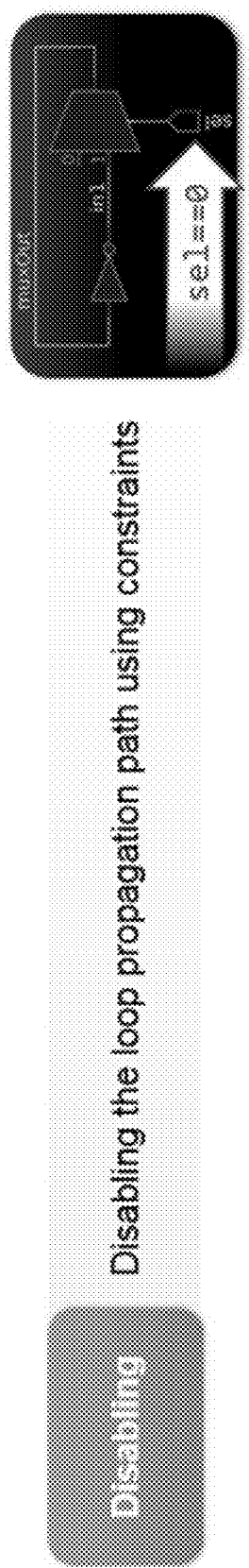
FIG. 8 is a diagram depicting an embodiment in accordance with the present disclosure.

Referring now to FIG. 8, an embodiment depicting a mechanism for disabling a loop propagation path using constraints in accordance with verification process 10 is shown. Disabling loops may consist of adding assumptions that disable the loop propagation path. Some advantages of such a configuration may include enabling netlist simplification and removing combinational feedback, disabling loops removes the chance of false positives/negatives, and improving proof performance by simplifying logic and forcing the engines to only consider legitimate functional modes as defined by the loop-disabling constraints.

Figure 9:
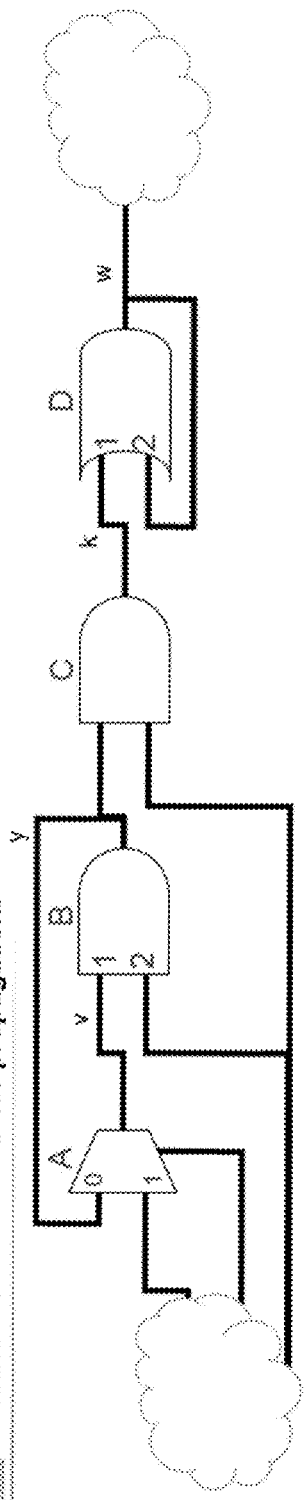
FIG. 9 is a diagram depicting an embodiment in accordance with the present disclosure.

Referring now to FIG. 9, an embodiment depicting an automated classification according to verification process 10 is provided. In this example it is not necessary to show the presence of propagating values along the structural path of a loop to determine if the loop is functional. As shown in the Figure, each loop may be composed of a chain of logical gates. Some may have one or more inputs that are not part of the loop's structural path. Given the logical functions of the gates they feed into, some can block propagation around the loop.

Figure 10:
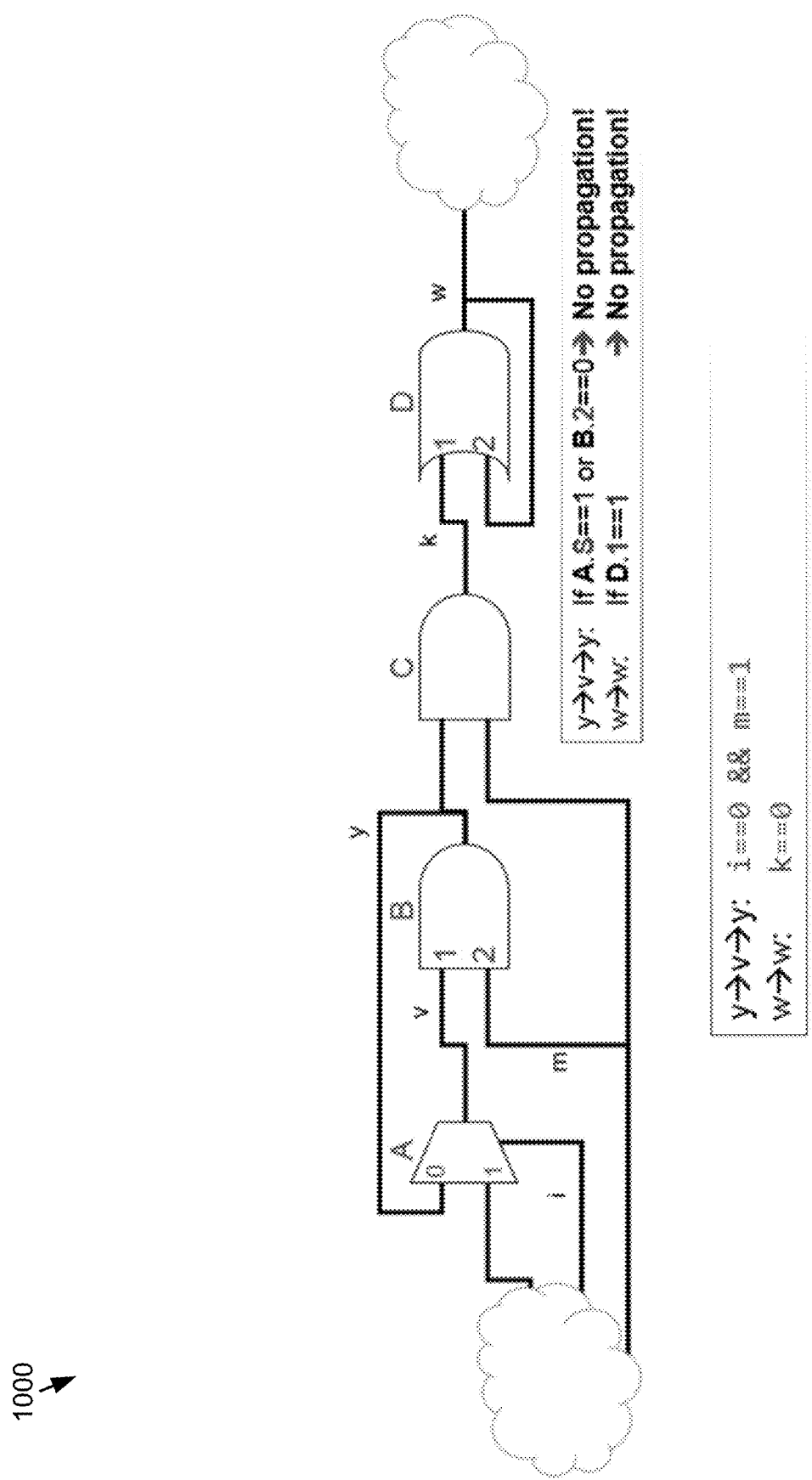
FIG. 10 is a diagram depicting an embodiment in accordance with the present disclosure.

Referring now to FIG. 10, an embodiment depicting an automated classification according to verification process 10 is provided. In this example, if a given loop meets a particular criterion (such as those shown in the Figure) it is possible to automatically extract an expression that, when true, represents a condition (or set of conditions) under which the structural loop being analyzed is a functional propagating loop. If the loop does not meet the criterion under which the expression can be extracted, or if the expression can be extracted but is subsequently proven false, then the loop is shown to be non functional (i.e., merely structural).

The automated classification of verification process 10 may provide numerous advantages. First, duplication of logic is not required as the size of state space to prove if the extracted expressions holds or not are both minimized. Second, no loop-breaking is performed. In this way, multiple proofs can be run in parallel without interfering with one another. The advantages above allow for scalability improvements (e.g., over dual-rail/Xpropagation models). Moreover, if the loop doesn't meet the criterion for extracting a propagation-enabling expression, no proof needs to be done at all: the loop is functional. The safest way to handle is adding stopats, avoiding false positives.

Figure 11:
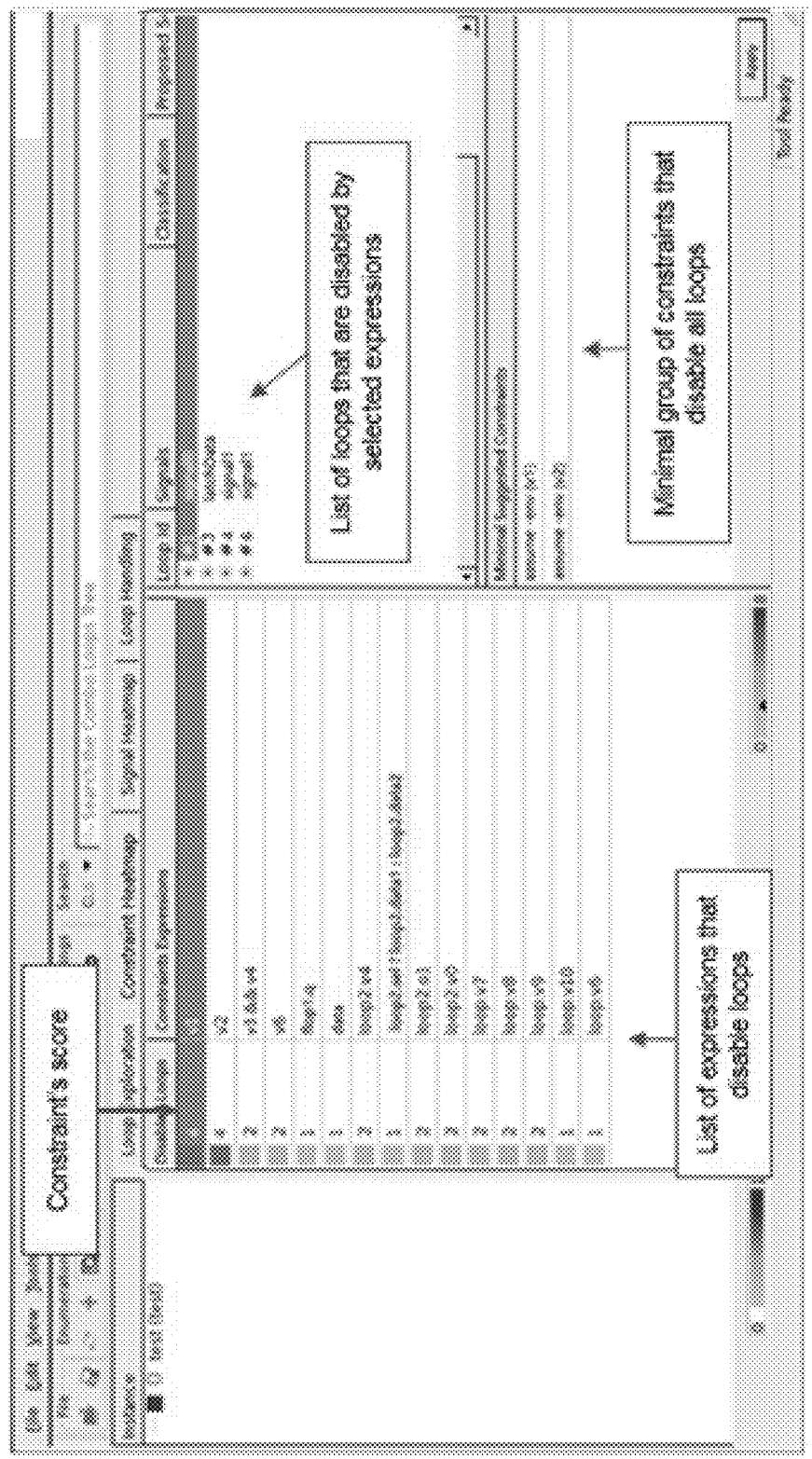
FIG. 11 is a diagram depicting an embodiment in accordance with the present disclosure.

Referring now to FIG. 11, an example of a graphical user interface 1100 consistent with embodiments of verification process 10 is provided. GUI 1100 may be used to analyze expression candidates. A sanity check may then be performed to avoid scenarios of constraint conflicts. The remaining candidates are ranked based on the number of loops disabled and the disabled loop characteristics. Some loop characteristics may include, but are not limited to, loop stability, known problematic structures, constrained signals type, etc. From the ranked set of constraints, either the full set of loop-disabling constraints, or a minimal group that disables loops and unblocks the verification flow, may be suggested. Accordingly, verification process 10 provides an easy to use approach where constraints suggested are often normal design configurations (scan enables, for instance) and, as such, may seem obvious to the user once they see them. By drawing the user's attention to the extracted constraints, much time and effort can be saved in other verification flows.

Figure 12:
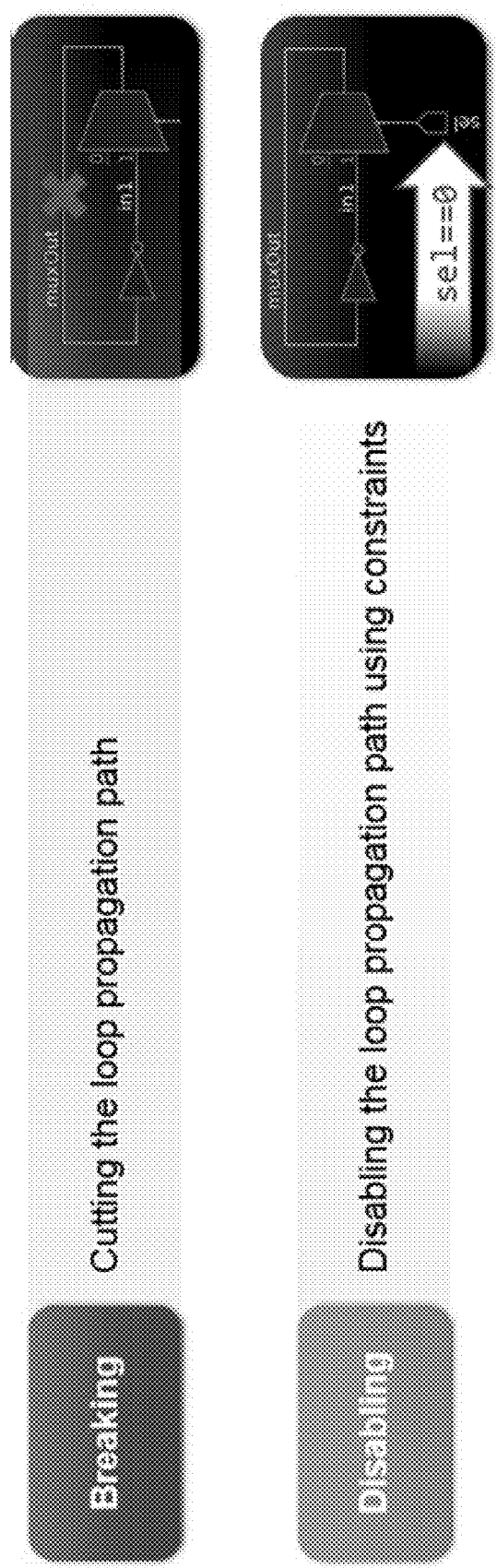
FIG. 12 is a diagram depicting an embodiment in accordance with the present disclosure.

Referring now to FIG. 12, a diagram 1200 consistent with embodiments of verification process 10 is provided. Diagram 1200 illustrates the difference between breaking and disabling combinational loops. Combinational loops do not fit naturally within the cycle-based zero-delay analysis that formal verification is usually based upon. Combinational loops need to be dealt with in some way to force them into the abstract view that the Formal Proof operates within. Handling combinational loops is a time-consuming and non-trivial task. It is often the case that simply assuming all structural loops are functional and disabling them all is quicker and easier than doing the work to determine which are truly functional and only disabling those. Great gains can be made in proof performance by forcing the engines to only consider legitimate functional modes as defined by the loop-disabling constraints (again, for example, by tying scan en to a constant value). As before, these constraints often seem obvious to the user once the user has been shown them by the flow, but the user may not have thought to put them in place otherwise.

Figure 13:
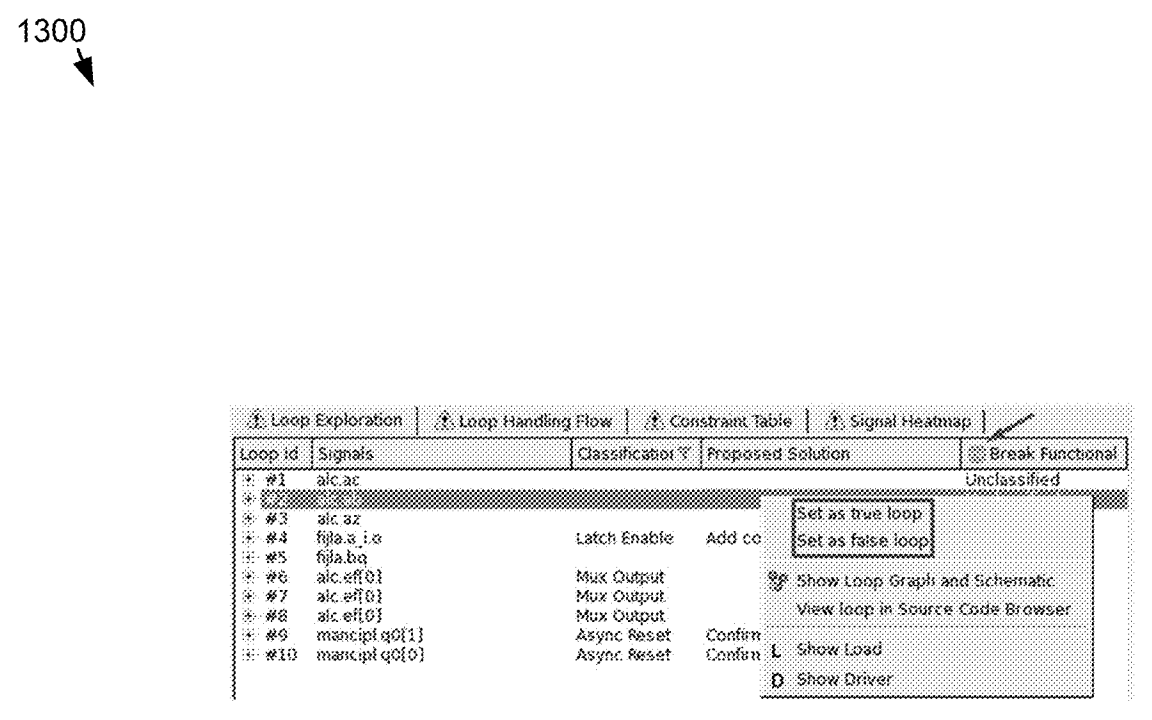
Figure 14:
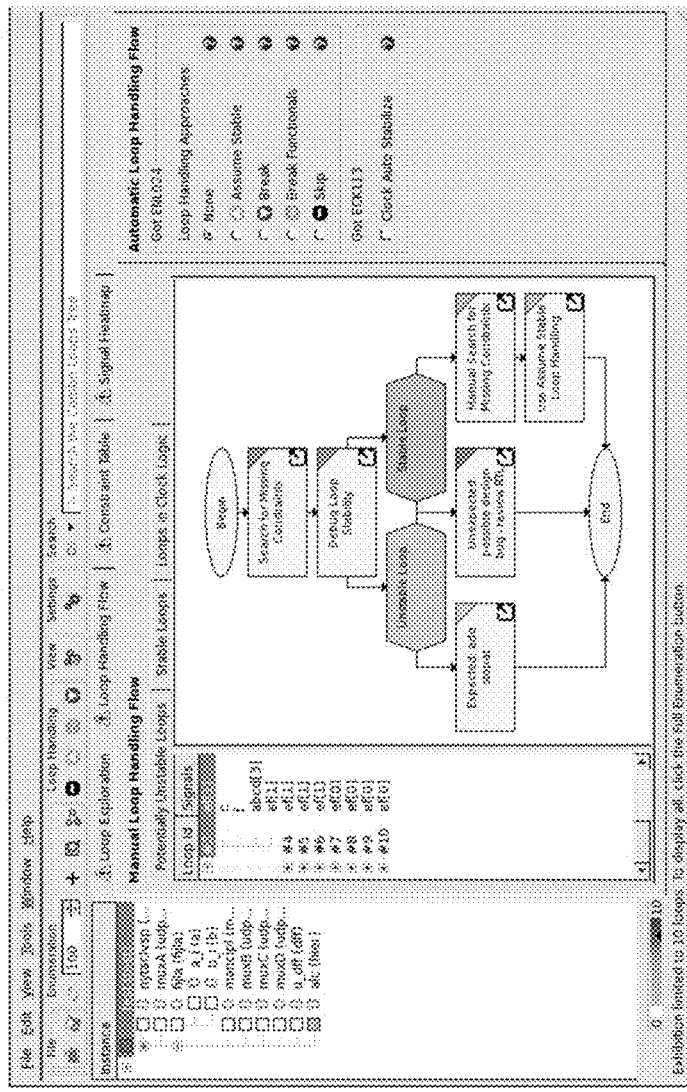
FIG. 14 is a diagram depicting an embodiment in accordance with the present disclosure.

Referring now to FIGS. 13-14, examples of a graphical user interfaces 1300 and 1400 consistent with embodiments of verification process 10 is provided. GUIs 1300 and 1400 show a loop handling tab that may be available using the combinational loop viewer. In this way, manual loop classification may be associated with a loop exploration tab and may only be active when using the break functional loop handling. Embodiments of verification process 10 may include both manual and automatic loop handling. For example, with regard to manual loop handling, one or more context-specific flowcharts may be displayed. These may include, but are not limited to, distinct flowcharts to debug "Potentially Unstable," "Stable," and "Clock Logic" loops. Rectangles may be interactive and direct the user to the most appropriate action for that context.

Figure 15:
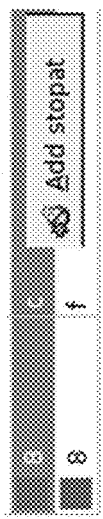
FIG. 15 is a diagram depicting an embodiment in accordance with the present disclosure.
Figure 15:
Figure 16:
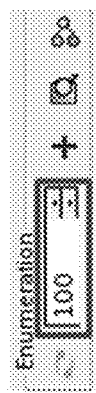
FIG. 16 is a diagram depicting an embodiment in accordance with the present disclosure.
Figure 17:
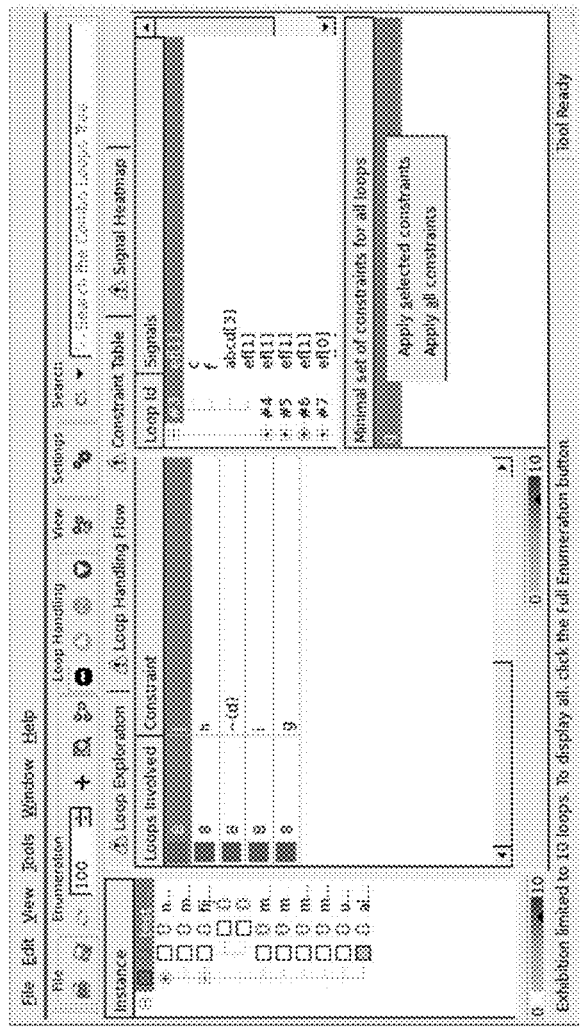
FIG. 17 is a diagram depicting an embodiment in accordance with the present disclosure.

Referring now to FIGS. 15-17, examples of a graphical user interfaces 1500, 1600, and 1700 consistent with embodiments of verification process 10 is provided. GUI 1500 displays the ability to add environment stopats from a Signal Heatmap context menu. GUI 1600 displays the ability to configure a number of loops to enumerate next on the toolbar (this was previously fixed at 10 per iteration). GUI 1700 displays a constraint table showing suggested constraints. In this particular example, the left pane depicts all constraints, with how many loops they affect. Accordingly, constraints may be applied with context menu option. The right pane depicts a list of loops affected by selected constraints. It should be noted that, in some embodiments, a "minimal set of constraints for all loops" may refer to the minimal group of constraints that disable the maximum number of combinational loops. Constraints may be applied with a context menu option or using any other suitable approach.

Embodiments of verification process 10 may provide a minimal group of constraints to disable loops. The check_loop-suggest_disables command lists suggestions for constraints that can functionally disable a combinational loop. A new switch (e.g., –minimal_group) to check_loop-suggest_disables may be used to return the minimal group of constraints that disables the maximum number of combinational loops.

In some embodiments, a new switch (e.g., check_loop-potentially_unstable) may be used to filter out trivially stable loops. This algorithm is pessimistic and might report stable loops as unstable.

Embodiments of verification process 10 may provide numerous advantages over existing approaches. Conventional methods usually rely on manual inspection, which is error prone and often impracticable. Conventional automated solutions leverage intricate dual-rail/X-Prop models, includes the full loop path (or parts thereof) and often along with its full neighboring logic. Verification process 10 may be configured to target a much smaller portion and representation (non-dual-rail) of the netlist, we tend to scale better on an exponential domain.

Additionally, in the first phase, no duplication of any logic is necessary, so the complexity and the size of state space needed to prove whether the extracted propagation-enabling expression holds or not are both minimized. Given this, multiple such proofs can be run in parallel without interfering with one another. In cases where the loop doesn't meet the criterion for extracting a propagation-enabling expression, no proof needs to be done at all: the loop is functional.

In the second phase, the constraints suggested in this step are often normal design configurations (scan enables, for instance) that seem obvious to the user once they see them, but may not have occurred to them in the context of loop analysis. By drawing their attention to the extracted constraints, much time and effort can be saved. Although disabling purely structural loops is technically unnecessary, it is often the case that simply assuming all structural loops are functional and disabling them all is quicker and easier than doing the work to determine which are truly functional and only disabling those. Moreover, once constraints can be found and applied, the netlist can be simplified and thus remove the combinational feedbacks. When the netlist cannot be simplified, since the states that the loop is active are removed, verification process 10 do not introduce the chance for false positives. Accordingly, great gains can be made in proof performance as simplifying logic and forcing the engines to only consider legitimate functional modes as defined by the loop-disabling constraints (again, for instance, by tying scan enables to a constant value). As before, these constraints often seem obvious to the user once the user has been shown them by the flow, but the user may not have thought to put them in place otherwise.

Embodiments included herein present a novel systematic progressive approach that targets scalability and automation problems existing implementations lack. By analyzing combinational loops disabling conditions in an iterative and customizable manner, verification process 10 may lessen the burden of finer grain analysis. By targeting inputs of the combinational path, the teachings of the present disclosure may avert the need for intricate flows and the necessity of duplicating the unrolled combinational loop netlist at bit-level. Moreover, by targeting individual pieces of the problem in a systematic manner, verification process 10 may provide a means to scale on large netlists. Finally, by providing graphical and intuitive user interfaces, the setup of formal environments is made more user friendly and assures more accurate results.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method comprising:
    receiving, using a processor, an electronic circuit design;
    identifying at least one combinational loop associated with the electronic circuit design;
    extracting, for each component of the loop, a set of logic conditions;
    modeling the at least one combinational loop;
    providing a graphical user interface configured to display one or more constraint candidates;
    determining whether or not a conflict exists between constraint candidates; and
    ranking the constraint candidates, based upon, at least in part, a number of loops disabled and one or more disabled loop characteristics.

2. The computer-implemented method of claim 1, wherein the one or more disabled loop characteristics includes a measure of loop stability.

3. The computer-implemented method of claim 1, wherein the one or more disabled loop characteristics includes one or more known problematic structures.

4. The computer-implemented method of claim 1, wherein the one or more disabled loop characteristics includes a type of constrained signal.

5. The computer-implemented method of claim 1, further comprising:
    displaying a minimal group of the ranked constraint candidates that disables all of the at least one combinational loop at the graphical user interface.

6. The computer-implemented method of claim 1, further comprising:
    displaying a full set of the ranked constraint candidates at the graphical user interface.

7. The computer-implemented method of claim 1, further comprising:
    disabling the at least one combinational loop using one or more constraints.

8. A computer-readable storage medium for use in an electronic design, the computer-readable storage medium having stored thereon instructions that when executed by a machine result in one or more operations, the operations comprising:
    receiving, using a processor, an electronic circuit design;
    identifying at least one combinational loop associated with the electronic circuit design;
    extracting, for each component of the loop, a set of logic conditions;
    modeling the at least one combinational loop;
    providing a graphical user interface configured to display one or more constraint candidates;
    determining whether or not a conflict exists between constraint candidates; and
    ranking the constraint candidates, based upon, at least in part, a number of loops disabled and one or more disabled loop characteristics.

9. The computer-readable storage medium of claim 8, wherein the one or more disabled loop characteristics includes a measure of loop stability.

10. The computer-readable storage medium of claim 8, wherein the one or more disabled loop characteristics includes one or more known problematic structures.

11. The computer-readable storage medium of claim 8, wherein the one or more disabled loop characteristics includes a type of constrained signal.

12. The computer-readable storage medium of claim 8, further comprising:
    displaying a minimal group of the ranked constraint candidates that disables all of the at least one combinational loop at the graphical user interface.

13. The computer-readable storage medium of claim 8, further comprising:
    displaying a full set of the ranked constraint candidates at the graphical user interface.

14. The computer-readable storage medium of claim 8, further comprising:
    disabling the at least one combinational loop using one or more constraints.

15. A system comprising:
    a computing device having at least one processor configured to receive, using a processor, an electronic circuit design, the at least one processor further configured to identify at least one combinational loop associated with the electronic circuit design, the at least one processor further configured to extract, for each component of the loop, a set of logic conditions, the at least one processor further configured to model the at least one combinational loop and provide a graphical user interface configured to display one or more constraint candidates, the at least one processor further configured to determine whether or not a conflict exists between constraint candidates and rank the constraint candidates, based upon, at least in part, a number of loops disabled and one or more disabled loop characteristics.

16. The system of claim 15, wherein the one or more disabled loop characteristics includes a measure of loop stability.

17. The system of claim 15, wherein the one or more disabled loop characteristics includes one or more known problematic structures.

18. The system of claim 15, wherein the one or more disabled loop characteristics includes a type of constrained signal.

19. The system of claim 15, further comprising:
    displaying a minimal group of the ranked constraint candidates that disables all of the at least one combinational loop at the graphical user interface.

20. The system of claim 15, further comprising:
    displaying a full set of the ranked constraint candidates at the graphical user interface.

* * * * *